United States Patent [19]

Stakhov et al.

[11] 4,290,051

[45] Sep. 15, 1981

[54] DEVICE FOR REDUCING IRRATIONAL-BASE CODES TO MINIMAL FORM

[76] Inventors: Alexei P. Stakhov, prospekt Kosmonavtov 54, kv. 130; Andrei A. Kozak, prospekt Leninskogo Komsomola 53, kv. 40; Nikolai A. Solyanichenko, ulitsa Vasilia Porika 30, kv. 108; Ivan V. Kuzmin, Kommunalny pereulok 3, kv. 6; Alexei D. Azarov, ulitsa Vasilia Porika, 30, kv. 103, all of Vinnitsa, U.S.S.R.

[21] Appl. No.: 62,175

[22] Filed: Jul. 30, 1979

[51] Int. Cl.³ .......................................... H03K 13/24
[52] U.S. Cl. ............................. 340/347 DD; 235/310; 364/736
[58] Field of Search ................ 340/347 DD; 235/310; 364/736

[56] References Cited

U.S. PATENT DOCUMENTS 4,187,500 2/1980 Stakhov et al. ................. 364/736 X Primary Examiner—Thomas J. Sloyan Attorney, Agent, or Firm—Lackenbach, Lilling & Siegel

[57] ABSTRACT

A device for reducing irrational-base codes to a minimal form, comprising "n" identical functional cells whereof each Bth cell incorporates a flip-flop with a count input and an AND convolution element intended to evaluate the possibility of performing the operation of convoluting the $(B-1)$th and $(B-p-1)$th code digits to the Bth code digit. One of the inputs of the AND convolution element is connected to an inverting output of the flip-flop whose direct output serves as an information output of the Bth functional cell. The flip-flop has its set, reset and count inputs connected to an information input, a convolution set input and an inversion signal input, respectively, of the Bth functional cell, the inversion signal input being connected to an information output of the $(B-1)$th functional cell. The remaining inputs of the AND convolution element are a first convolution signal input, a second convolution signal input and a convolution control input of the Bth functional cell. An output of the AND convolution element is a convolution signal output of the Bth functional cell, which output is respectively connected to a first convolution signal input and a second convolution signal input of the $(B-1)$th and $(B-p-1)$th functional cells.

4 Claims, 4 Drawing Figures

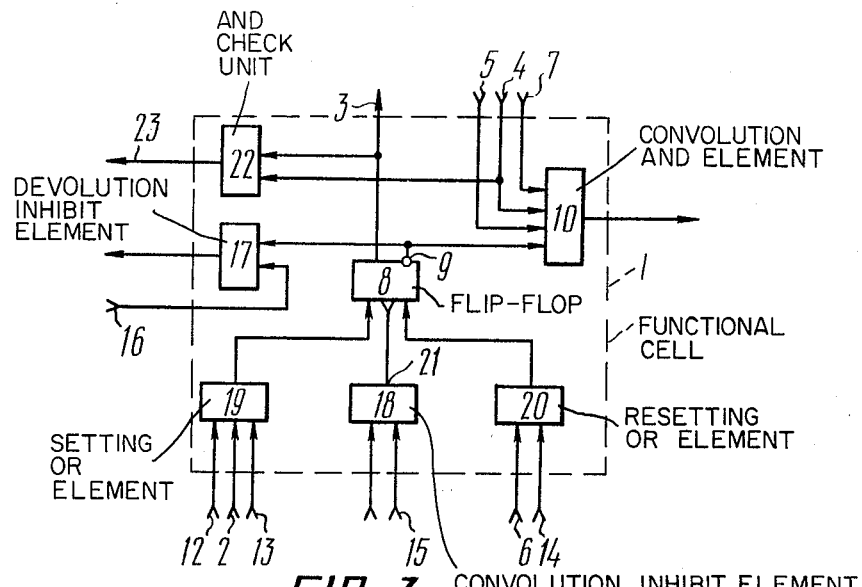

DEVICE FOR REDUCING IRRATIONAL-BASE CODES TO MINIMAL FORM

FIELD OF THE INVENTION

The present invention relates to computer equipment and, more particularly, to devices for reducing irrational-base codes to a minimal form.

The invention is applicable to digital computers, digital data processing systems, digital measuring instruments and systems for reducing irrational-base codes to a minimal form.

BACKGROUND OF THE INVENTION

It is known that any natural number N may be represented as follows:

$$N = \sum_{B=0}^{n=B} a_B \varphi_p(B), \quad (1)$$

where n is the digit capacity of the code, and $\varphi_p(B)$ is a certain Fibonacci p-number.

Fibonacci p-numbers are determined with $p \geq 0$, which is an integer, by the following recurrence relation:

$$\varphi_p(B) = \begin{cases} 0 \text{ with } B < 0 \\ 1 \text{ with } B = 0 \\ \varphi_p(B-1) + \varphi_p(B-P-1) \text{ with } B > 0. \end{cases} \quad (2)$$

With $p=0$, Fibonacci p-codes are a generalization of the classical binary method of number representation; with $p=\infty$, they coincide with what is known as the "unitary" code (cf. A. P. Stakhov, "Vvedeniye v algoritmicheskuyu teoriyu izmereniy"/"Introduction to the Algorithmic Theory of Measurements"/, Sovietskoye Radio Publishers, Moscow, 1977).

The "golden" p-code signifies a higher level of notation. The "golden" p-code of a real number A is the following method whereby A is represented as a sum total of degrees of the "golden" p-proportion where $p \in \{1, 2, 3, \ldots, \infty\}$:

$$A = \sum_{B=-\infty}^{\infty} a^B \lambda_p^B, \quad (3)$$

where $\lambda_p^B \in \{0, 1B\}$ is a binary number in the Bth digit of the "golden" p-code; $\lambda_p^B$ is the weight of the Bth digit (i.e. the Bth degree of the "golden" p-proportion); $\lambda_p^B$ is the "golden" proportion which is the real root of this equation:

$$X^{p+1} = X^p + 1. \quad (4)$$

With $p=1$, $$\lambda_1 = \frac{1 + \sqrt{5}}{2}.$$

The coefficient $$\lambda_1 = \frac{1 + \sqrt{5}}{2}$$

is referred to as the "golden" proportion; hence, the name of the code (3).

The "golden" proportion $\lambda_p$ possesses this fundamental property:

$$p^n = p^{n-1} + p^{n-p-1}, \quad (5)$$

which follows directly from (4).

Fibonacci p-codes and "golden" p-codes are irrational-base codes, since $$\lim_{n \to \infty} \frac{\varphi_p(n+1)}{\varphi_p(n)} = \lambda_p. \quad (6)$$

The basic distinguishing feature of irrational-base codes is their redundancy, which means that each number A has several representations in irrational-base codes. For example, with $p=1$, the number 8 can be represented by the following Fibonacci I-code ($p=1$):

| Weights of Digits | 13 | 8 | 5 | 3 | 2 | 1 | 1 | |
|---|---|---|---|---|---|---|---|---|
| Fibonacci 1-code | 0 | 1 | 0 | 0 | 0 | 0 | 0 | |
| | 0 | 0 | 1 | 1 | 0 | 0 | 0 | = 8 |
| | 0 | 0 | 1 | 0 | 1 | 1 | 0 | |
| | 0 | 0 | 1 | 0 | 1 | 0 | 1 | |

In the "golden" I-code:

| Weights of Digits | $\lambda_1^4$ | $\lambda_1^3$ | $\lambda_1^2$ | $\lambda_1^1$ | $\lambda_1^5$ | $\lambda_1^{-1}$ | $\lambda_1^{-2}$ | $\lambda_1^{-3}$ | $\lambda_1^{-4}$ | |
|---|---|---|---|---|---|---|---|---|---|---|
| | 1 | 0 | 0 | 0 | 1 | 0 | 0 | 0 | 1 | |
| | 0 | 1 | 1 | 0 | 1 | 0 | 0 | 0 | 1 | = 8 |
| | 0 | 1 | 1 | 0 | 0 | 1 | 1 | 0 | 1 | |
| | 0 | 1 | 0 | 1 | 1 | 1 | 1 | 0 | 1 | |

An important concept of the theory of irrational-base codes is the concept of the normal, or minimal, form. This is to be understood as an irrational-base code of a number A, wherein any group of $p+1$ successive code digits does not have more than one units digit. The process of reducing an irrational-base code to a minimal form is referred to as normalization of an irrational-base code. With $p=1$, the normalization is carried out by performing all operations involved in the convolution of binary digits of the irrational-base code. The convolution of binary units digits $a_{n-1}$ and $a_{n-2}$ to the zero digit $a_n = 0$ is to be understood as a replacement of the digit values by the respective negative values, i.e.

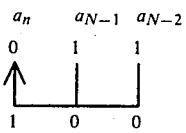

The operation of convolution is designated as

The reverse operation is referred to as devolution of a digit and designated as

It must be emphasized that the operations of convolution and devolution of binary digits do not alter the number A represented by a code because of the fundamental feature expressed in (5).

The convolution of the "golden" code comprises performing all the operations involved in the convolution of binary digits. Here is an example for the golden proportion code:

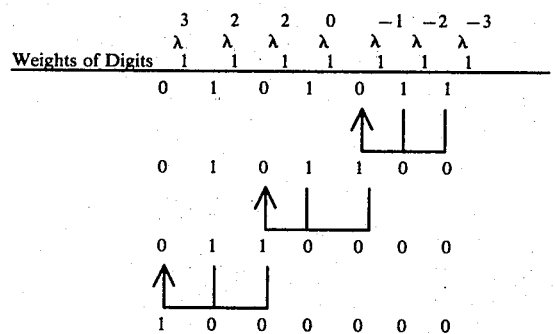

The devolution of the "golden" code consists in performing all the operations involved in the devolution of the binary digits.

For example, for the "golden" proportion code:

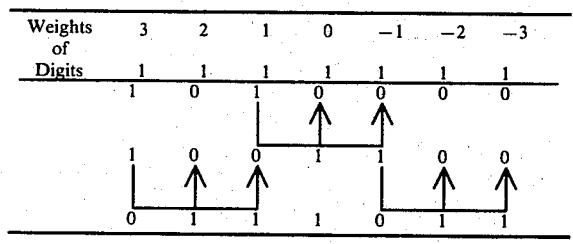

DESCRIPTION OF THE PRIOR ART

There is known but a single device for reducing an irrational-base code, namely, the Fibonacci p-code, to a minimal form. The device comprises identical functional cells, each having an information input and an information output. Code combinations of a number A are applied to the information input and read out from the information output. Each functional cell further includes information convolution inputs, a set input, a convolution control input and a convolution signal output. All these are interconnected in accordance with the algorithm of the device.

All the functional cells have an identical circuitry which incorporates a flip-flop, as well as AND and OR gates.

The device under review is disadvantageous in that it does not eliminate misoperation of the flip-flops, a phenomenon known as "signal race", while reducing a Fibonacci p-code to a minimal form. Misoperation may be due to the fact that the parameters of components incorporated in a functional cell are not in keeping with the specification; as a result, the operation cannot be timed correctly. Consider the following example of reducing the number 10 to the minimal form of the Fibonacci I-code. The number 10 is represented as follows:

| Weights of Digits | 13 | 8 | 5 | 3 | 2 | 1 | 1 |
|---|---|---|---|---|---|---|---|
| No of Cell | 6 | 5 | 4 | 3 | 2 | 1 | 0 |
| Code 10 | 0 | 0 | 1 | 1 | 1 | 0 | 0 |

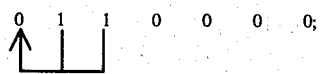

While convoluting to the fifth functional cell, there may arise a situation when the flip-flop of this cell is reset faster than the flip-flop of the third functional cell, which is because the parameters of the components of the fourth functional cell do not correspond to the specification. As a result, there are produced the conditions for the convolution to the fourth functional cell and the resultant code is like this:

0 1 1 0 0 0 0;

hence, there is produced the condition for the convolution to the sixth functional cell. The final code is like this: 1 0 0 0 0 0 0, which means that the reduction to the minimal form is wrong. To generalize, it can be stated that a "race" may occur in all the $2^n - \varphi_p(n)$ cases of reducing an initial code to its minimal form.

Besides, the device under review has a limited functional range, because the convolution and devolution operations can only be performed on the Fibonacci p-codes.

SUMMARY OF THE INVENTION

It is an object of the present invention to improve the operating reliability of the device for reducing irrational-base codes to a minimal form.

It is another object of the invention to provide a device for reducing irrational-base codes to a minimal form, which would ensure a noise-proof storage of information, such that makes it possible to detect a high percentage of malfunctions of the flip-flop setting type and correct any malfunction of the flip-flop resetting type.

It is still another object of the invention to provide a device for reducing irrational-base codes to a minimal form, which would be capable of converting a digital-pulse code of any predetermined "golden" p-proportion degree to a respective "golden" p-code.

Finally, it is an object of the invention to provide a device which would make it possible to add up "golden" p-codes.

The present invention consists in providing a device for reducing irrational-base codes to a minimal form, comprising "n" identical functional cells in a number equal to the number of code digits. Each functional cell has at least an information input, an information output, a convolution set input, two convolution information inputs, a convolution control input and a convolution signal output which in the Bth functional cell is connected to the set input of the (B−p−1)th functional cell, its information output being connected to a first convolution information input of the (B+1)th functional cell and to a second convolution information input of the (B+p+1)th functional cell. In accordance with the invention, each functional cell includes an inversion signal input which in the Bth functional cell is connected to the information output of the (B−1)th functional cell, where n is the digit capacity of the irrational-base code, B=0, 1, 2, ..., (n−1), and p=1.

It is expedient, according to the invention, that in a device where the irrational-base code is the Fibonacci p-code and the "golden" proportion p-code, each functional cell, beginning with B=1, should include a flip-flop with a count input, its inverting output being connected to an input of an AND element whose other inputs are respectively connected to the convolution information inputs and convolution control input of the same functional cell. A output of the AND element and a direct output of the flip-flop are respectively connected to the convolution signal output and the information output of the same functional cell. A set input, a reset input and a count input of the flip-flop of the Bth functional cell are respectively connected to the information input, the convolution set input and the inversion signal input of the same functional cell, the functional cell corresponding to the low order of the code being a flip-flop.

In order to perform the code devolution operation, it is desirable, according to the invention, that each functional cell should additionally include two devolution signal inputs intended to receive devolution signals, a reset signal input, a convolution inhibit signal input, a devolution inhibit signal input. and A devolution signal output which in the Bth functional cell is connected to the first devolution signal input of the (B−1)th functional cell and to the second devolution signal input of the (B−p−1)th functional cell. The devolution inhibit signal inputs and convolution inhibit signal inputs are respectively connected to two common points which are the devolution inhibit signal input and convolution inhibit signal input, respectively, of the device for reducing irrational-base codes to a minimal form.

In order to perform the operation of devolution, it is essential that each functional cell of the device, according to the invention should, include a devolution inhibit gate, a convolution inhibit gate, a flip-flop setting OR element and a flip-flop resetting OR element. A first input of the devolution inhibit gate is connected to the inverting output of the flip-flop, and a second input and an output of the devolution inhibit gate are the devolution inhibit signal input and devolution signal output, respectively, of the same functional cell. A first input and a second input of the convolution inhibit gate are the convolution inhibit signal input and inversion signal input, respectively, and an output of the convolution inhibit gate is connected to the count input of the flip-flop. The set input of the flip-flop is connected to the information input and to the devolution signal inputs of the same functional cell via the flip-flop setting OR element, and the reset input of the flip-flop is connected to the reset signal input and the convolution set input via the flip-flop resetting OR element.

In order to check if the device operates properly, it is advisable that each functional cell should include a check output and contain an AND check element whose first input and second input are respectively connected to the information output and convolution information input of the same functional cell, its output serving as a check output of the functional cell.

In order to expand the functional range of the device, it is expedient that in the device in accordance with the invention, where the irrational-base code is the "golden" p-proportion code, the Bth functional cell, beginning with B=2, should have a functional input and include an OR delay element whose inputs are connected to the remaining inputs of the flip-flop resetting OR element, a third input of the flip-flop setting OR element being connected to the functional input and the second devolution signal input of the Bth functional cell via the OR delay element.

The present invention makes it possible to improve the operating reliability of devices for reducing irrational-base code, namely, Fibonacci p-codes and the "golden" p-proportion codes, to a minimal form. The invention provides a simplified functional cell circuitry and makes it possible to perform such additional operations as the transformation of degrees of the "golden" p-proportion code, the counting of pulses and adding up "golden" p-proportion codes.

BRIEF DESCRIPTION OF THE DRAWINGS

Other objects and advantages of the present invention will become more apparent from a consideration of the following detailed description of preferred embodiments thereof, taken in conjunction with the accompanying drawings, wherein:

FIG. 3 is a block diagram of one embodiment of the functional cell, in accordance with the invention; and FIG. 4 is a block diagram of another embodiment of the functional cell in accordance with the invention, which accounts for a broader functional range of the device for the case of the transformation of "golden" p-proportion codes, in accordance with the invention.

DETAILED DESCRIPTION OF THE INVENTION

Figure 1:
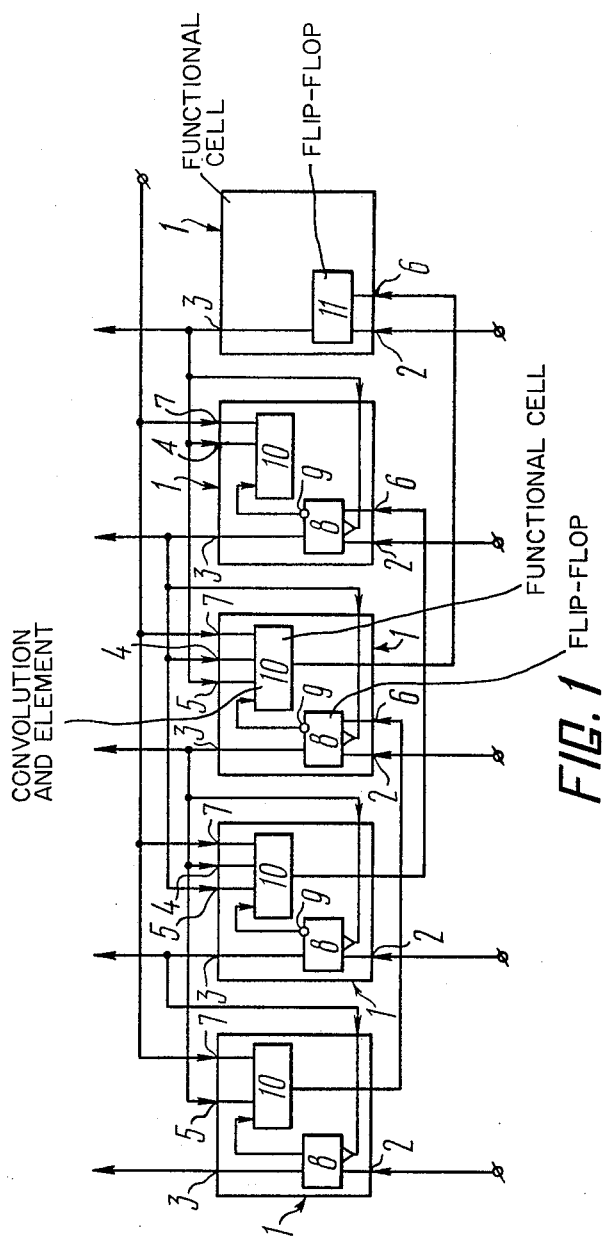
FIG. 1 is a block diagram of a device for reducing irrational-base codes to a minimal form, which performs the convolution of code combinations, in accordance with the invention.

FIG. 1 is a block diagram of a preferred embodiment of the device, according to the invention, for reducing irrational-base codes to a minimal form with p=1 and n=5, where n is the digit capacity of the code and where the irrational-base code is the Fibonacci I-code or "golden" proportion I-code.

The device comprises n, i.e. five, identical functional cells 1, whereof each Bth cell (let it be assumed that 1=2) has an information input 2 intended to record information in the form of a code digit. The Bth cell further includes an information output 3 for reading out information on the stage of the functional cell 1, as well as a first convolution information input 4 and a second convolution information input 5 which are intended to receive information on the state of the $(B-1)$th and $(B-p-1)$th, i.e. $(B-2)$th, functional cells 1. Each of the Bth functional cells 1 further has a set input 6 to which there is applied a one signal for resetting the Bth functional cell; the Bth cell further includes a convolution control input 7 which, when receiving a one signal, enables a possible operation of convolution; the Bth cell alas has a convolution signal output connected to the set input 6 of the $(B-p-1)$th functional cell 1 (a one signal is produced at the convolution signal output if the convolution condition is satisfied); the Bth cell further includes an inverting input intended to receive a signal for inverting the state of the functional cell 1 while performing the convolution operation. The convolution signal output of the Bth functional cell 1 is connected to the convolution set input 6 of the $(B-p-1)$th, i.e. $(B-2)$th, functional cell 1. The information output 3 of the 1th functional cell 1 is connected to the first convolution information input 4 of the $(B+1)$th functional cell 1 and the second information input 5 of the $(B+p+1)$th, i.e. $(B+2)$th, functional cell 1. The convolution control inputs 7 of all the functional cells 1 are connected to a common bus which serves as a control input for the whole device, and to which there is applied a one control signal whenever it is necessary to reduce a Fibonacci p-code or a "golden" proportion p-code to a minimal form. The information outputs 3 of all the functional cells 1 make up a multidigit information output of the device with the number of digits equal to n. The information inputs 2 of all the functional cells 1 make up a multidigit information input of the device, intended to enter the information on the number in an irrational-base code.

The 1th functional cell 1 further has an inversion signal input connected to the information output 3 of the $(B-1)$th functional cell and intended to receive an inversion signal which alters the state of the 1th functional cell 1.

Each 1th functional cell 1, beginning with $l=1$, has a flip-flop 8 with a count input. In all the functional cells 1, with the exception of that functional cell I which corresponds to the lower digit of the code, an inverting output 9 of the flip-flop 8 is connected to an input of a convolution AND element 10. The other inputs of the convolution AND element 10 are respectively connected to the convolution information input 4, the convolution information input 5 and the convolution control input 7 of the functional cell 1. An output of the convolution AND element 10 serves as a convolution signal output of the Bth functional cell 1. A one signal is produced at the output of the convolution AND element 10 if the flip-flop 8 is reset and if one signals are applied to the first information input 4, the second information input 5 and the convolution control input 7. A direct output of the flip-flop 8 is the information output 3 of the functional cell 1. The set and reset inputs of the flip-flop 8 are respectively connected to the information input 2 and the convolution set input 6 of the functional cell 1.

The functional cell 1, which corresponds to the lower order of the code, is a flip-flop 11. As is seen from FIG. 1, some inputs are not activated in the functional cells 1 corresponding to the two lowest $(B=0, 1=1)$ digits and the highest $(B=n-1)$ digit. For example, the convolution information input 5 is not activated in the functional cell 1 corresponding to the first digit; the set inputs 6 are not activated in the functional cells 1 corresponding to the third and fourth digits. However, all the functional cells 1 are of the same type; if a greater number of digits is required, the chain of the functional cells 1 is to be built up on the side of the higher $(B=n-1)$ digit so as to activate all the inputs of the third and fourth functional cells 1. In this case the lower order functional digit 1 remains as shown in FIG. 1.

Figure 2:
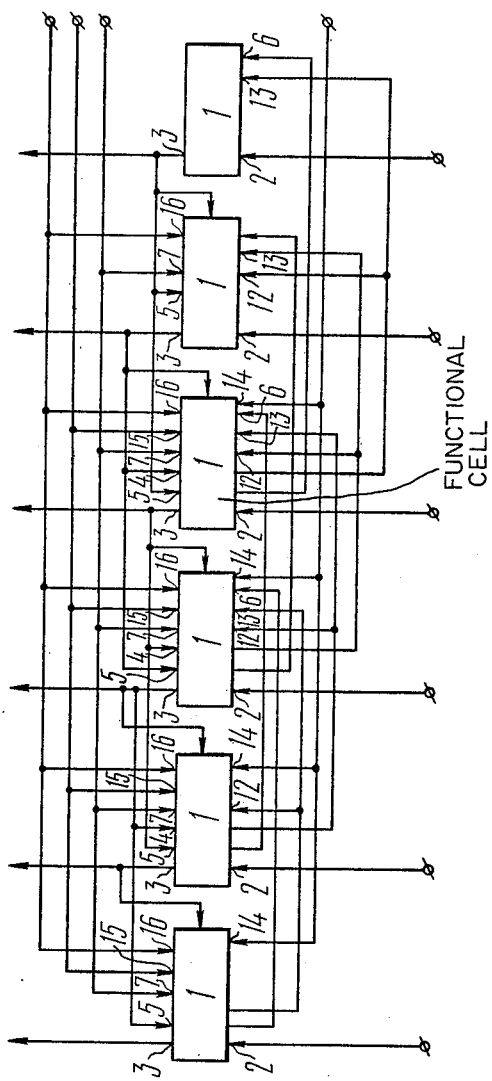
FIG. 2 is a block diagram of a device which performs the convolution and devolution of code combinations, in accordance with the invention.

FIG. 2 shows an alternative embodiment of the device according to the invention for reducing irrational-base codes to a minimal form with $p=1$ and $n=6$. In this case the irrational-base codes are the Fibonacci I-code and the "golden" proportion p-code. The device of FIG. 2 comprises six identical functional cells 1 and differs from the device of FIG. 1 in that each functional cell 1 also has a first devolution signal input 12 and a second devolution signal input 13 to which a one signal is applied while performing a devolution operation, which signal brings the functional cell 1 to the one state; a reset signal input 14 intended to receive a one signal and thus reset the functional cell 1; a convolution inhibit signal input 15 intended to receive a signal which inhibits the convolution operation; a devolution inhibit signal input 16 intended to receive a signal which inhibits the devolution operation; and a devolution signal output respectively connected to the inputs 12 and 13 of the $(B-1)$th and $(B-p-1)$th functional cells 1. A one signal is produced at this output if the devolution condition is satisfied. The convolution inhibit signal inputs 15 of all the functional cells 1 are connected to a common convolution inhibit bus of the device; a one signal at this bus inhibits possible convolutions. The devolution inhibit signal inputs are connected to a common devolution inhibit bus of the device; a one signal at this bus inhibits possible devolutions.

As is seen from FIG. 2, some inputs of the functional cells 1 are not activated. For example, the convolution inhibit signal input 15 and devolution inhibit signal input 16 are not actuated in the functional cell 1 corresponding to the lowest $(B=0)$ digit, which equally applies to the devolution signal output and the devolution signal input 12; the convolution inhibit signal input 15 and the devolution signal output are not activated in the functional cell 1 of the first digit; the devolution signal inputs 12 and 13 are not activated in the functional cell 1 corresponding to the highest $(B=n-1)$ digit; the devolution signal input 13 is not activated in the functional cell 1 corresponding to the $(n-2)$th digit. If it is necessary to have more than n digits, the chain of the functional cells 1 should be built up on the side of the higher digit so as to activate all the above-mentioned inputs and outputs.

FIG. 3 presents an embodiment of the Bth (let it be assumed that $B=2$) functional cell 1 which comprises a devolution inhibit gate 17, a convolution inhibit gate 18, a flip-flop setting OR element 19 and a flip-flop resetting OR element 20.

A first input of the devolution inhibit gate 17 is the devolution inhibit signal input 16; a second input of the devolution inhibit gate 17 is connected to the inverting output 9 of the flip-flop 8; an an output of the devolution inhibit gate 17 is the devolution signal output.

The devolution inhibit gate 17 is intended to block the passage of a one signal from the inverting output of the flip-flop 8 to the devolution signal output in the presence of an inhibit signal at the devolution inhibit input 16. The convolution inhibit gate 18 is intended to block the passage of a one signal from the information output 3 of the (B−1)th (FIG. 2) functional cell 1 to the inversion signal input while performing the operation of convolution and in the presence of an inhibit signal at the convolution inhibit input 15. The output of the flip-flop setting OR element 19 (FIG. 3) is connected to the set input of the flip-flop 8. The inputs of the flip-flop setting OR element 19 are intended to receive signals from the first devolution signal input 12, the information input 3 and the second devolution signal input 13. These inputs serve to enter initial information in the flip-flop 8 and set it while performing devolution. The output of the OR element 20 is connected to the reset input of the flip-flop 8. The inputs of the OR element 20 are intended to receive signals from the reset signal input 14 and the convolution set input 6. These inputs serve to reset the flip-flop 8 while performing devolution and convolution, respectively.

An output 21 of the convolution inhibit gate 18 is connected to the count input of the flip-flop 8. The functional cell 1 further includes an AND check element 22 whose first input is connected to the information output 3, whose second input is connected to the first convolution information input 4, and an output is a control output 23 of the functional cell 1.

The AND check element is intended to check an irrational-base code for a minimal form attribute. A one signal is produced at its output if the Bth and (B−1)th functional cells 1 are in the one state.

FIG. 4 shows an alternative embodiment of the Bth functional cell 1 incorporated in a device which transforms only the "golden" p-proportion code. Unlike the embodiment of FIG. 3, each Bth functional cell 1 of FIG. 4, beginning with B=2, includes an OR delay element 24 whose first input is connected to the second devolution signal input 13, and whose second input is connected to a functional input 25. The second devolution signal input 13 is connected to a third input of the OR element 20 and the functional input 25 is connected to the remaining, i.e. fourth, input of the OR element 20.

The functional input 25 is intended to receive information one signals while transforming a digital-pulse code of the "golden" p-proportion degrees to the "golden" p-proportion code, as well as while counting pulses in the "golden" p-proportion code or adding up "golden" proportion p-codes.

The device according to the invention for reducing irrational-base codes to a minimal form (FIG. 1) operates as follows. Suppose one has to reduce to a minimal form the number 5 represented in the Fibonacci I-code which differs from the minimal. The representation is like this:

| Weights of Digits | 5 | 3 | 2 | 1 | 1 |
|---|---|---|---|---|---|
| No of Functional Cell 1 | 4 | 3 | 2 | 1 | 0 |
| Fibonacci I-Code | 0 | 1 | 0 | 1 | 1 |

Through the information inputs 2 (FIG. 1), the code is entered in the flip-flops 8 and the flip-flop 11 of the functional cells of the third, first and zero digits. As a one signal is applied to the control input of the device, the AND element 10 of the Bth functional cell 1, at whose inputs there arrive one signals from the information outputs 3 of the (B−1) and (B−p−1)th functional cells 1 and from the inverting output 9 of the flip-flop 8 of the Bth cell 1, analyzes the possibility of performing convolution. In this case the condition for convolution (i.e. the presence of a zero signal at the information outputs 3 of the Bth functional cell 1 and of one signals at the information outputs 3 of the (B−1)th and (B−p−1)th functional cells 1) applies to the second functional cell 1. A one signal is produced at the output of the AND element 10, i.e. at the convolution signal output of the second functional cell 1; through the convolution set input 6, this signal resets the flip-flop 11 of the functional cell of the zero digit.

A zero signal is produced at the information output 3 of this functional cell 1 and is applied through the inversion signal input to the count input of the flip-flop 8 of the first functional cell 1 and resets the flip-flop 8. As this takes place, a zero signal is produced at the information output 3 of the first functional cell 1; the zero signal is applied to the count input of the flip-flop 8 of the second functional cell 1 and sets this flip-flop 8. The first convolution is over. The resultant code recorded by the device is this: 01100. The convolution condition is satisfied in this case for the fourth functional cell 1. At the convolution signal output of this functional cell there is produced a one signal, whereupon the process continues as described above:

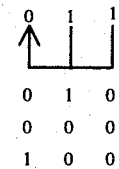

```
0  1  0
0  0  0
1  0  0
```

As a result, the initial combination 01011 becomes 10000, which corresponds to the minimal form of the number 5 in the Fibonacci 1-code. The duration of the one signal at the control input of the device must necessarily be in excess of the time required for performing all possible convolutions. The convolution being over, the information on the minimal Fibonacci 1-code is read out from the information outputs 3 of the functional cells 1. The "golden" p-proportion code is reduced to a minimal form in a similar manner. It must be emphysized at this point that the device in accordance with the invention for reducing irrational-base codes to a minimal form eliminates ambiguities in reducing any Fibonacci p-code to a minimal form. The device of this invention is such that the operation of convolution is carried out sequentially from the (B−p−1)th digit to the (B−1)th digit and from the (B−1)th digit to the Bth digit. If there is a condition for convolution for the Bth, (B−1)th and (B−p−1)th functional cells 1, the first step is the resetting of the flip-flop 8 of the (B−p−1)th functional cell 1. Zero potential is produced at the information output of this cell and is applied to the count input of the flip-flop 8 of the (B−1)th functional cell 1 to reset that flip-flop 8; thus the flip-flop 8 of the Bth functional cell 1 is set. As a result, it is unnecessary to simultaneously change the state of the flip-flops 8 of the three digits.

The devolution of an irrational-base code is carried out as follows. Let it be assumed that the following "golden" proportion 1-code is entered in the device:

$$\begin{array}{cccccc} \lambda^2 & \lambda^1 & \lambda^0 & \lambda^{-1} & \lambda^{-2} & \lambda^{-3} \\ 1 & 0 & 1 & 0 & 0 & 0 \end{array}$$

An inhibit potential is applied to the convolution inhibit input 15 (FIG. 2) from an external control unit (not shown), whereas an enable potential is applied to the devolution inhibit input 16.

A pulse distributor (not shown) is then brought into play and successively applies one signals to the reset signal inputs 14 of all the functional cells 1, beginning with the cell 1 corresponding to $\lambda^{-1}$. The one signal applied to the reset signal input 14 of the functional cell 1, which corresponds to the weight $\lambda^0$, resets the flip-flop 8 through the OR element 20. A one signal is produced at the inverting output 9 of this flip-flop 8 and is applied via the conducting devolution inhibit gate 17 to the first devolution signal input 12 of that functional cell 1 which corresponds to the weight $\lambda^{-1}$; this signal is also applied to the second devolution signal input 13 of that functional cell 1 which corresponds to the weight $\lambda^{-2}$. The one signal is then applied via the OR elements 19 to the set inputs of the flip-flops 8 of the above-mentioned functional cells 1 and sets these flip-flops 8. The resultant code is as follows:

$$\begin{array}{cccccc} \lambda^2 & \lambda^1 & \lambda^0 & \lambda^{-1} & \lambda^{-2} & \lambda^{-3} \\ 1 & 0 & 1 & 0 & 0 & 0 \\ 1 & 0 & 0 & 1 & 1 & 0 \text{ - new state} \end{array}$$

As a one signal is subsequently applied to the reset signal input 14 of the functional cell 1 corresponding to the weight $\lambda^2$, the resultant processes are similar to those described above, and the resultant code is as follows:

$$\begin{array}{cccccc} \lambda^2 & \lambda^1 & \lambda^0 & \lambda^{-1} & \lambda^{-2} & \lambda^{-3} \\ 1 & 0 & 0 & 1 & 1 & 0 \\ 0 & 1 & 1 & 1 & 1 & 0 \text{ - new state} \end{array}$$

At this point the devolution process is over.

The introduction into each functional cell 1 of the AND check element 22 provides for information storage conditions which make it possible to detect malfunctions of the flip-flops 8 and 11.

Let it be assumed that entered in the device is a minimal code of the "golden" p-proportion, such as:

$$\begin{array}{cccccc} \lambda^2 & \lambda^1 & \lambda^0 & \lambda^{-1} & \lambda^{-2} & \lambda^{-3} \\ 0 & 1 & 0 & 1 & 0 & 0 \end{array}$$

The introduction of information into the device is a controllable process. In fact, if the recording of the minimal code of the "golden" p-proportion is accompanied by an error in the minimal form attribute of the code, the error is detected by the presence of one signals at the control output 23 of at least one functional cell 1.

Following the recording of the minimal code of the "golden" p-proportion, the storage of the code is also controlled. In order to carry out this process, it is necessary to remove the inhibit signal from the devolution inhibit input 16 and apply an inhibit signal to the convolution inhibit input 15. Let it now be assumed that a spurious signal resets the flip-flop 8 of the functional cell 1 corresponding to the weight $\lambda^1$. As a result, at the inverting output 9 of the flip-flop 8 of this functional cell 1 there is produced a one signal which is applied via the conducting gate 17 to the devolution signal output. This signal is applied via the first devolution signal input 12 and flip-flop setting OR element 19 to the set input of the flip-flop 8 of the functional cell 1 corresponding to the weight $\lambda^0$, whereby this flip-flop 8 is set. This one signal is also applied via the second devolution signal input and OR element 19 to the set input of the flip-flop 8 of the functional cell 1 corresponding to the weight $\lambda^{-1}$. But this latter flip-flop 8 is already in the one state and thus remains. The resultant "golden" proportion code is like this:

$$\begin{array}{cccccc} \lambda^2 & \lambda^1 & \lambda^0 & \lambda^{-1} & \lambda^{-2} & \lambda^{-3} \\ 0 & 0 & 1 & 1 & 0 & 0 \end{array}$$

This code differs from the normal. As a result, a one signal, which is indicative of an error, is produced at the control output 23 of the functional cell 1 corresponding to the weight $\lambda^0$. Thus the device, whose functional cell 1 is shown in FIG. 3, makes it possible to detect all malfunctions of the flip-flops 8 of the 1→0 type. A high percentage of malfunctions of the 0→1 (about 99 percent with n=20) is also detected.

The device, whereof the functional cell 1 is shown in FIG. 4, provides for information storage conditions such that malfunctions of the 1→0 type do not erase digital information. This is due to the introduction of the OR delay element 24 whereof one of the inputs is connected to the second devolution signal input 13. The same input is connected to the third input of the flip-flop resetting OR element 20.

Suppose the same "golden" proportion code is entered in the device:

$$\begin{array}{cccccc} \lambda^2 & \lambda^1 & \lambda^0 & \lambda^{-1} & \lambda^{-2} & \lambda^{-3} \\ 0 & 1 & 0 & 1 & 0 & 0 \end{array}$$

There is an inhibit potential at the convolution inhibit input 15; on the other hand, the inhibit potential is removed from the devolution inhibit input 16. Suppose now that again a spurious signal resets the flip-flop 8 of the functional cell 1 corresponding to the weight $\lambda^1$. A one signal is produced at the devolution signal output of this functional cell and applied to the first devolution signal input 12 of the functional cell 1 corresponding to the weight $\lambda^0$, whereby the flip-flop 8 of this functional cell 1 is set. The same one signal is applied to the second devolution signal input 13 of the functional cell 1 corresponding to the weight $\lambda^{-1}$. This leads to the following sequence of events. Via the flip-flop resetting OR element, the one signal is applied to the flip-flop 8 and resets it. As a result, this one signal proceeds via the conducting devolution inhibit gate 17 to the devolution signal output of the functional cell 1 corresponding to the weight $\lambda^{-1}$. This sets the flip-flops 8 of the functional cells 1 corresponding to the weights $\lambda^{-2}$ and $\lambda^{-3}$, the setting being brought about as described above.

The same one signal from the second devolution signal input 13 of the functional cell corresponding to the weight $\lambda^{-1}$ passes through the OR delay element 24 and is applied, after a time $\tau$ from the moment the flip-flop 8 of that functional cell is reset, to the input of the OR element and, consequently, to the set input of the same flip-flop 8, whereby the latter is set. The resultant code is this:

$$\begin{array}{cccccc} \lambda^2 & \lambda^1 & \lambda^0 & \lambda^{-1} & \lambda^{-2} & \lambda^{-3} \\ 0 & 0 & 1 & 1 & 1 & 1 \end{array}$$

An inhibit potential is then applied to the devolution inhibit input 16, and the inhibit potential is removed from the convolution inhibit input 15. As a one signal is applied to the control input of the device, the given "golden" proportion code is reduced to a minimal form in the manner described above, i.e.:

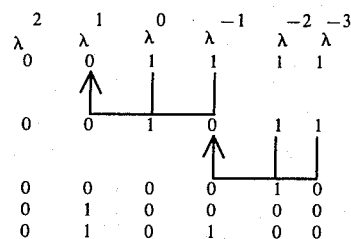

The resultant code combination coincides with the initial combination, which means that the code is reproduced correctly. Thus if the probability of malfunctions of the 1→0 type is much higher than the probability of malfunctions of the 0→1 type, the device of this invention can effectively correct errors; in fact, it corrects all errors of the 1→0 type. If the opposite is true, the device can be used as an error detector.

The introduction into the functional cell of FIG. 4 of the OR element producing a delay with a value of $\tau$ makes it possible to expand the functional range of the device. This device can transform the digital-pulse code of the "golden" proportion degrees to the "golden" p-proportion code; it can count pulses and give the result in a "golden" proportion code; and it can add up "golden" proportion codes.

When transforming the digital-pulse code of any degree of the "golden" proportion to the "golden" p-proportion code, device transforms the sum total $$\underbrace{\lambda^n + \lambda^{n-1} + \ldots + \lambda^n}_{\text{N times}}$$

to the "golden" proportion code.

With n=0, the device transforms the sequence of unities $$\underbrace{1 + 1 + \ldots + 1}_{\text{N times}}$$

to the "golden" proportion code.

To make it possible, it is necessary to apply an inhibit potential to the devolution inhibit input 16 and remove the inhibit potential from the convolution inhibit input 15. This is followed by successively applying short pulses to the functional input 25 of the functional cell 1 corresponding to the degree of the golden proportion subject to transformation. The duration of these pulses is not to be greater than the delay time $\tau$ of the OR delay element 24, and the number of these pulses must be equal to a preselected number N. As a short pulse arrives at the functional input 25 of a given functional cell 1, it appears, after the delay $\tau$, at the reset input of the flip-flop 8. The delay is due to the OR element 20. After another delay of $2\tau$, which is due to the OR delay element 24 and flip-flop setting OR element 19, the pulse arrives at the set input of the flip-flop 8. If at this instant the flip-flop is in its one state, it is first zeroed and after $\tau$ is set again. As this takes place, a one signal is produced at the devolution signal output, i.e. at the output of the gate 17 (at this moment the devolution inhibit gate is turned on); the one signal is further applied to the first devolution signal input 12 and the second devolution signal input 13 of the functional cells 1 of the lower digits. The flip-flops 8 of these functional cells 1 are set. If the flip-flop 8 of the functional cell 1 corresponding to the degree of the "golden" proportion subject to transformation is reset, it is set after $2\tau$. After a certain delay in relation to the count pulses, which delay is to be long enough for the transient involved in the devolution of the "golden" proportion code to come to an end, a control signal must be applied to the convolution control input of the device. The duration of the control signal must be sufficiently long for the transient involved in the convolution of the "golden" proportion code to come to an end.

To perform the operation of convolution, an inhibit potential is applied to the devolution inhibit input 16, while an enable potential is applied to the convolution inhibit input 15.

Consider now the pulse count mode. At the start of the operation, all the flip-flops 8 of the device are reset. There is an inhibit potential at the devolution inhibit input 16 and an enable potential at the convolution inhibit input 15. The first count pulse is applied to the functional input 25 of the functional cell 1 corresponding to the weight $\lambda^0$ to set the flip-flop 8 of this functional cell 1. The following code results:

$$1 = \begin{array}{cccccc} \lambda^2 & \lambda^1 & \lambda^0 & \lambda^{-1} & \lambda^{-2} & \lambda^{-3} \\ 0 & 0 & 1 & 0 & 0 & 0 \end{array}$$

To perform convolution, one signals are applied to the convolution control input of the device. The parameters of these signals are dealt with above.

The second count pulse arrives via the flip-flop resetting OR element 20 to reset the flip-flop 8. As a result, a one signal is produced at the devolution signal output and applied via the first devolution signal input 12 and the flip-flop resetting OR element 20 to the flip-flop 8 of the functional cell 1 corresponding to the weight $\lambda^{-1}$. The flip-flop 8 is set. The one signal is also applied via the second devolution signal input 13, the OR delay element 24 and the flip-flop setting OR element 19 to the flip-flop 8 of the functional cell 1 corresponding to the weight $\lambda^{-2}$; this flip-flop 8, too, is set. The second count pulse also arrives via the delay OR element 24 and the flip-flop setting OR element 19 at the set input of the flip-flop 8 of the functional cell 1 corresponding to the weight $\lambda^0$. The appearance of this signal at the set input of the flip-flop 8 occurs after a delay of $2\tau$, as compared with the time of its arrival at the functional input 25; the flip-flop 8 is set. Thus the second count pulse brings the device to this state:

$$2 = \begin{array}{cccccc} \lambda^2 & \lambda^1 & \lambda^0 & \lambda^{-1} & \lambda^{-2} & \lambda^{-3} \\ 0 & 0 & 1 & 1 & 1 & 0 \end{array}$$

As a convolution enable one pulse is applied to the control input of the device, the code convolution is performed as described above; this means that the device is brought to the following state:

$$2 = \begin{array}{cccccc} \lambda^2 & \lambda^1 & \lambda^0 & \lambda^{-1} & \lambda^{-2} & \lambda^{-3} \\ 0 & 1 & 0 & 0 & 1 & 0 \end{array}$$

which is the minimal form of representation of the number 2 in the "golden" code.

It is clearly seen that following the arrival of the third and fourth count pulses, the states of the device are changed like this:

$$3 = \begin{cases} \begin{array}{cccccc} \lambda^2 & \lambda^1 & \lambda^0 & \lambda^{-1} & \lambda^{-2} & \lambda^{-3} \\ 0 & 1 & 1 & 0 & 1 & 0 \\ 1 & 0 & 0 & 0 & 1 & 0 \end{array} \end{cases}$$

$$4 = \quad 1 \quad 0 \quad 1 \quad 0 \quad 1 \quad 0$$

a one signal applied to the control input of the device is not followed by convolution. As a result, there is a permanent one signal at the control output 23 of the functional cell 1 in question. Thus the convolution process is a self-supervisory process.

Consider now the process of adding up numbers in the "golden" p-proportion code carried out by a nine-digit device similar to the six-digit device shown in FIG. 2.

The device performs the functions of a sequential-type adder-accumulator. This is done as follows. Suppose the operation of 4+4 has to be performed in the "golden" code. For this purpose, the "golden" code of the first summand is entered in the device:

$$\begin{array}{ccccccccc} \lambda^4 & \lambda^3 & \lambda^2 & \lambda^1 & \lambda^0 & \lambda^{-1} & \lambda^{-2} & \lambda^{-3} & \lambda^{-4} \\ 0 & 0 & 1 & 0 & 1 & 0 & 1 & 0 & 0 \end{array}$$

after which each of the units digits must be applied to the respective functional inputs 25 of the device. If the addition is carried out from the lower digits side, the process is as follows:

(1) as a one signal of the second digit is applied:

$$\begin{array}{ccccccccc} \lambda^4 & \lambda^3 & \lambda^2 & \lambda^1 & \lambda^0 & \lambda^{-1} & \lambda^{-2} & \lambda^{-3} & \lambda^{-4} \\ 0 & 0 & 1 & 0 & 1 & 0 & 1 & 0 & 0 \\ 0 & 0 & 0 & 0 & 0 & 0 & 1 & 0 & 0 \end{array} \Big\} \text{addition}$$

$$\left. \begin{array}{ccccccccc} 0 & 0 & 1 & 0 & 1 & 0 & 1 & 1 & 1 \\ 0 & 0 & 1 & 0 & 1 & 1 & 0 & 0 & 1 \\ 0 & 0 & 1 & 1 & 0 & 0 & 0 & 0 & 1 \\ 0 & 1 & 0 & 0 & 0 & 0 & 0 & 0 & 1 \end{array} \right\} \text{reducing code to minimal form}$$

(2) as a one signal of the fourth digit is applied:

$$\begin{array}{ccccccccc} \lambda^4 & \lambda^3 & \lambda^2 & \lambda^1 & \lambda^0 & \lambda^{-1} & \lambda^{-2} & \lambda^{-3} & \lambda^{-4} \\ 0 & 1 & 0 & 0 & 0 & 0 & 0 & 0 & 0 \\ 0 & 0 & 0 & 0 & 1 & 0 & 0 & 0 & 0 \\ \hline 0 & 1 & 0 & 0 & 1 & 0 & 1 & 0 & 0 \end{array} \Big\} \text{addition}$$

(3) as a one signal of the sixth digit is applied:

$$\begin{array}{ccccccccc} \lambda^4 & \lambda^3 & \lambda^2 & \lambda^1 & \lambda^0 & \lambda^{-1} & \lambda^{-2} & \lambda^{-3} & \lambda^{-4} \\ 0 & 1 & 0 & 0 & 1 & 0 & 0 & 0 & 1 \\ 0 & 0 & 1 & 0 & 0 & 0 & 0 & 0 & 0 \\ \hline 0 & 1 & 1 & 0 & 1 & 0 & 0 & 0 & 1 \\ 1 & 0 & 0 & 0 & 1 & 0 & 0 & 0 & 1 \end{array} \Big\} \text{addition} \Big\} \text{reducing code to minimal form}$$

The addition is over.

The device according to the invention is to a great extent self-supervisory. Operation of the device invariably results in a minimal "golden" proportion code. If a code is not reduced to a minimal form because of some fault in the circuitry, the malfunction is detected at once by the presence of a permanent one signal at the control output 23 of one of the functional cells 1. Let it be assumed that the output of the convolution AND element 10 of one of the functional cells 1 is cut off. When this situation arises:

It can easily be inferred from the above that the device according to the invention for reducing irrational-base codes to a minimal form features a higher reliability and a broader functional range than the prototype. It can be used as the basic unit of systems operating with Fibonacci p-codes and "golden" proportion codes. It can be used as a principal component around which all the basic units of a self-supervisory digit instrument can be built. Thus the major practical value of the present invention is an increased accuracy and reliability of digital instrumentation operating with irrational-base codes.

What is claimed is:

1. A device for reducing irrational-base codes to a minimal form, comprising:
   n identical functional cells;
   a Bth functional cell comprising: an information input from which code information is entered; an information output from which code information is read; first and second convolution information inputs respectively receiving information on the state of (B−1)th and (B−p−1)th functional cells and respectfully connected to said information outputs of these functional cells; a convolution signal output at which a convolution signal is formed if the condition for convolution of the code digits for said Bth functional cell is satisfied; a convolution set input receiving a signal which resets said Bth functional cell and connected to said convolution signal output of a (B+p+1)th functional cell; a convolution control input receiving a signal which enables convolution of said Bth functional cell; and an inversion signal input receiving a signal which reverses the state of said Bth functional cell and connected to said information output of said (B−1)th functional cell;
   wherein n is the digit capacity of the code, B=1, 2, ..., (n−1), and p=1;
   wherein each of said functional cells, except the functional cell corresponding to the lowest order digit, comprises:
   a flip-flop recording and storing information on the Bth digit of the code and having a count input connected to said inversion signal input, a set input connected to said information input, a reset input connected to said convolution set input, a direct output connected to said information output, and an inverting output; and
   a convolution AND element evaluating the possibility of performing the operation of convolution of the (B−1)th and (B−p−1)th code digits to the Bth digit and generating a one signal which resets said flip-flop of said (B−p−1)th functional cell if the convolution condition is satisfied, said convolution AND element having a first input connected to said inverting output of said flip-flop, second and third inputs connected to said first and second convolution information inputs, a fourth input connected to said convolution control input, and an output connected to said convolution signal output; and
   wherein said functional cell corresponding to the lowest order digit comprises a flip-flop.

2. A device as claimed in claim 1, wherein said Bth functional cell also includes: first and second devolution signal inputs receiving signals which indicate the necessity of performing the operation of devolution of the (B+1)th and (B+p+1)th code digits to the Bth digit; a reset signal input receiving a signal which resets said flip-flop of said Bth functional cell; a convolution inhibit signal input receiving a signal which inhibits the operation of convolution, said convolution inhibit signal inputs of each of said functional cells being combined and connected to a convolution inhibit signal input of the device; a devolution inhibit signal input receiving a signal which inhibits the operation of devolution, said devolution inhibit signal inputs of each of said functional cells being combined and connected to a devolution inhibit signal input of said device; a devolution signal output at which a devolution signal is generated when zero value of the Bth code digit is entered in said Bth functional cell, said devolution signal output being connected to said devolution signal inputs of said (B−1)th and (B−p−1)th functional cells; wherein each Bth functional cell further comprises:
   a devolution inhibit gate having a first input connected to said inverting output of said flip-flop, a second input connected to said devolution inhibit signal input, and an output connected to said devolution signal output; a convolution inhibit gate having an output connected to said count input of said flip-flop, a first input connected to said convolution inhibit signal input, and a second input connected to said inversion signal input; a flip-flop setting OR element having an output connected to said set input of said flip-flop, first and second inputs respectively connected to said first and second devolution signal inputs, and a third input connected to said information input; and
   a flip-flop resetting or element having a first input connected to said reset signal input, a second input connected to said convolution said input, and an output connected to said reset input of said flip-flop.

3. A device as claimed in claim 2, wherein said Bth functional cell further comprises:
   an AND check element having an output connected to a control output of said Bth functional cell, a first input connected to said direct output of said flip-flop, and a second input connected to said first convolution signal input, a signal being generated at said output of said AND check element when one signals appear at said output of said flip-flop and said first convolution signal input.

4. A device as claimed in claim 3, wherein said Bth functional cell further comprises: an OR delay element to delay devolution signals applied to said input of said flip-flop, said OR delay element having a first input connected to a functional input of said Bth functional cell which receives signals enabling pulse count and addition operations, a second input connected to said second devolution signal input, and an output connected to said third input of said flip-flop setting or element; wherein said flip-flop resetting OR element includes third and fourth inputs respectively connected to said second devolution signal input and said functional input.

* * * * *